United States Patent
Liao et al.

(10) Patent No.: US 10,393,600 B2
(45) Date of Patent: Aug. 27, 2019

(54) PORTABLE ELECTRONIC DEVICE AND SENSING METHOD THEREOF

(71) Applicant: HTC Corporation, Taoyuan (TW)

(72) Inventors: Yu-Jing Liao, Taoyuan (TW); Shih-Po Chien, Taoyuan (TW); Yi-Ting Liu, Taoyuan (TW); Chun Tseng, Taoyuan (TW)

(73) Assignee: HTC Corporation, Taoyuan (TW)

( * ) Notice: Subject to any disclaimer, the term of this patent is extended or adjusted under 35 U.S.C. 154(b) by 137 days.

(21) Appl. No.: 15/379,490

(22) Filed: Dec. 15, 2016

(65) Prior Publication Data

US 2018/0172525 A1 Jun. 21, 2018

(51) Int. Cl.
*G01L 1/14* (2006.01)
*H03K 17/975* (2006.01)
*H03K 17/96* (2006.01)

(52) U.S. Cl.
CPC ............ *G01L 1/144* (2013.01); *H03K 17/975* (2013.01); *H03K 17/962* (2013.01)

(58) Field of Classification Search
CPC ........ G06F 1/169; G06F 3/044; G06F 3/0414; G06F 3/041; H03K 17/962; G01L 1/144
See application file for complete search history.

(56) References Cited

U.S. PATENT DOCUMENTS

| | | | |
|---|---|---|---|
| 6,542,721 B2 | 4/2003 | Boesen | |
| 7,218,313 B2 | 5/2007 | Marcus et al. | |
| 7,800,592 B2* | 9/2010 | Kerr | G06F 1/1626 345/173 |
| 8,120,625 B2* | 2/2012 | Hinckley | G06F 1/1626 345/659 |
| 8,917,239 B2* | 12/2014 | Eriksson | G06F 3/042 345/156 |
| 9,047,009 B2* | 6/2015 | King | G06F 1/1626 |
| 9,134,760 B2* | 9/2015 | Hinckley | G06F 1/1626 |
| 9,983,742 B2* | 5/2018 | King | G06F 3/044 |
| 2003/0085870 A1* | 5/2003 | Hinckley | G06F 1/1626 345/156 |
| 2006/0197750 A1* | 9/2006 | Kerr | G06F 1/1626 345/173 |
| 2009/0262078 A1 | 10/2009 | Pizzi | |
| 2010/0020034 A1 | 1/2010 | Kim | |
| 2011/0021251 A1 | 1/2011 | Linden | |

FOREIGN PATENT DOCUMENTS

| | | |
|---|---|---|
| TW | I418282 | 12/2013 |
| TW | I486744 | 6/2015 |
| TW | I512367 | 12/2015 |

OTHER PUBLICATIONS

"Office Action of Taiwan Counterpart Application," dated Jul. 28, 2017, p. 1-p. 3, in which the listed references were cited.

* cited by examiner

*Primary Examiner* — Freddie Kirkland, III
(74) *Attorney, Agent, or Firm* — JCIPRNET

(57) ABSTRACT

A portable electronic device including a supporting plate, a frame, and a sensing component is provided. The supporting plate has a first sensing side surface. The frame is assembled around the supporting plate and has a second sensing side surface facing the first sensing side surface. The sensing component is disposed between the first sensing side surface and the second sensing side surface. The sensing component is configured to sense a variation in a distance to the first sensing side surface or sense a variation in a distance to the second sensing side surface. Moreover, a sensing method is also provided.

12 Claims, 4 Drawing Sheets

PORTABLE ELECTRONIC DEVICE AND SENSING METHOD THEREOF

BACKGROUND OF THE INVENTION

Field of the Invention

The application relates to a portable electronic device and, in particular, a portable electronic device having a sensing function and a sensing method thereof.

Description of Related Art

With the advance in the electronics industries, common portable electronic devices (e.g., mobile phones, smart phones, tablet computers, and laptops) are generally developed to be more convenient, multi-functional, and good-looking. To achieve the goal of becoming more convenient, small in size, and human-centered, the input device of many of the current portable electronic products has gradually been changed from a traditional mechanical button to a touch button.

Nowadays, disposing a touch button on a display surface of the portable electronic device has become mainstream, while the frame of the portable electronic device is still generally disposed with a mechanical button. However, the mechanical button not only incurs higher costs, but there are also issues of mechanical loss and short service life. Moreover, the design of the mechanical button is less good-looking, is large in size, and is not in line with the purpose of human-centered design.

SUMMARY OF THE INVENTION

The application provides a portable electronic device, wherein an input device of a frame has a sensing function to replace a mechanical button.

The application provides a sensing method for a portable electronic device to sense an external force applied by a user.

The portable electronic device of the application includes a supporting plate, a frame, and a sensing component. The supporting plate includes a first sensing side surface. The frame is assembled around the supporting plate and includes a second sensing side surface facing the first sensing side surface. The sensing component is disposed between the first sensing side surface and the second sensing side surface. The sensing component is configured to sense a variation in a distance to the first sensing side surface or sense a variation in a distance to the second sensing side surface.

In one embodiment of the application, the first sensing side surface and the second sensing side surface are planes and are parallel to each other.

In one embodiment of the application, the portable electronic device further includes a buffer component disposed between the sensing component and the second sensing side surface or disposed between the sensing component and the first sensing side surface.

In one embodiment of the application, the frame includes a recess, the sensing component is disposed in the recess, and the second sensing side surface is a bottom surface of the recess.

In one embodiment of the application, the frame includes a protrusion and a surface of the protrusion is the second sensing side surface.

In one embodiment of the application, the sensing component includes a plurality of sensing electrodes independent of each other.

The sensing method of the application is adapted for the foregoing portable electronic device. The sensing method includes the following steps: applying an external force to the frame to generate a variation in a distance between the sensing component and the second sensing side surface or generate a variation in a distance between the sensing component and the first sensing side surface; generating a sensing signal through the sensing component according to the variation in the distance; and triggering a command according to the sensing signal.

In one embodiment of the application, the sensing signal is generated according to a capacitance variation generated by the variation in the distance.

In light of the above, in the portable electronic device of the application, when the user applies an external force to the frame, the sensing component generates the sensing signal according to the variation in the distance, and then the command is triggered according to the sensing signal. Accordingly, the user only needs to apply an external force to the frame of the portable electronic device to trigger the command, and it is not necessary to additionally dispose a mechanical button on the frame of the portable electronic device. The portable electronic device without the mechanical button is good-looking, small in size, and close to the purpose of human-centered design.

BRIEF DESCRIPTION OF THE DRAWINGS

The accompanying drawings are included to provide a further understanding of the application, and are incorporated in and constitute a part of this specification. The drawings illustrate embodiments of the application and, together with the description, serve to explain the principles of the application.

DESCRIPTION OF THE EMBODIMENTS

Figure 1:
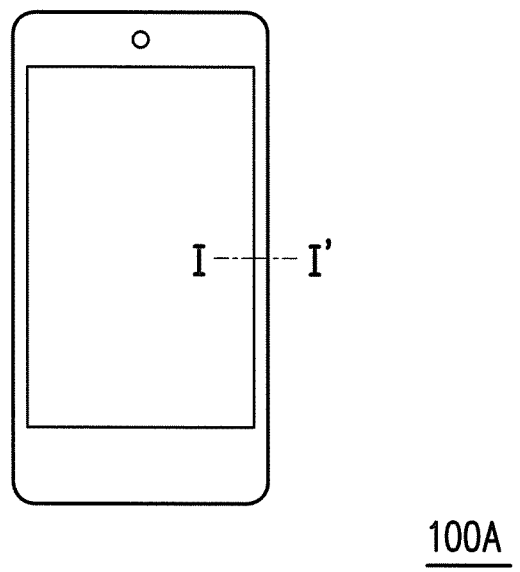
FIG. 1 is a schematic diagram illustrating a portable electronic device according to a first embodiment of the application.

Reference will now be made in detail to the present preferred embodiments of the application, examples of which are illustrated in the accompanying drawings. Wherever possible, the same reference numbers are used in the drawings and the description to refer to the same or like parts.

Figure 2:
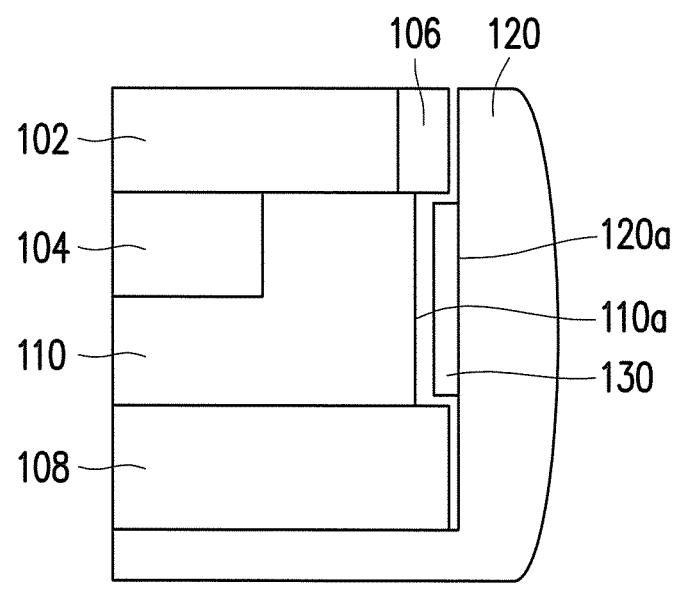
FIG. 2 is a partially enlarged view illustrating a cross section along a line I-I' of FIG. 1.

FIG. 1 is a schematic diagram illustrating a portable electronic device according to a first embodiment of the application. FIG. 2 is a partially enlarged view illustrating a cross section along a line I-I' of FIG. 1. Referring to FIG. 1 and FIG. 2, a portable electronic device 100A of the present embodiment has a sensing function and is adapted for a user to perform command operations by touching. Moreover, the portable electronic device 100A is, for example, a mobile phone or a tablet computer. However, the application is not limited hereto.

As illustrated in FIG. 2, the portable electronic device 100A of the present embodiment includes a supporting plate 110, a frame 120, and a sensing component 130. The supporting plate 110 has a first sensing side surface 110a. The frame 120 is assembled around the supporting plate 110 and has a second sensing side surface 120a facing the first sensing side surface 110a. The sensing component 130 is disposed between the first sensing side surface 110a and the second sensing side surface 120a. The sensing component 130 is configured to sense a variation in a distance to the first sensing side surface 110a.

By way of illustration, the portable electronic device 100A of the present embodiment further includes, for example, a glass cover plate 102, a display module 104, at least one plastic gasket 106, and a battery 108. The glass cover plate 102, for example, covers the display module 104 and has a material with a high transmittance for a user to clearly view information displayed by the portable electronic device 100A through the glass cover plate 102. The display module 104 is, for example, an LCD module or another display module for displaying information such as power, time, weather, etc. that the user would like to know. The at least one plastic gasket 106, for example, provides insulation between components of the portable electronic device 100A or is configured to fill in a gap in the portable electronic device 100A. The supporting plate 110 is, for example, a metal internal frame that is disposed in the portable electronic device 100A and is, for example, manufactured by a die casting method or another manufacturing method, and serves as a supporting structure of an interior of the portable electronic device 100A. The frame 120 is assembled around the supporting plate 110, the glass cover plate 102, the display module 104, the at least one plastic gasket 106, and the battery 108. The frame 120 has a material of, for example, plastic, metal, etc. and may be in any shape or style. The application is not limited hereto. The supporting plate 110 of the present embodiment has the first sensing side surface 110a, and the frame 120 has the second sensing side surface 120a facing the first sensing side surface 110a. The first sensing side surface 110a and the second sensing side surface 120a are, for example, planes and are parallel to each other. The sensing component 130, for example, includes a flexible circuit board and components disposed thereon and is disposed between the first sensing side surface 110a and the second sensing side surface 120a. When the user applies an external force to the frame 120, a variation in a distance between the sensing component 130 and the first sensing side surface 110a is generated. The sensing component 130 is configured to sense the variation in the distance between the sensing component 130 and the first sensing side surface 110a. Accordingly, the user only needs to apply the external force to the frame of the portable electronic device 100A to trigger a command, and it is not necessary to additionally dispose a mechanical button on the frame of the portable electronic device 100A. Since the frame of the portable electronic device 100A no longer includes the protruding mechanical button, the user not only enjoys a smoother tactile feeling when holding the portable electronic device 100A, but does not need to worry about mechanical abrasion of the mechanical button resulting from long-term use, and can perform command operations on the portable electronic device 100A without any concern. In the present embodiment, the sensing component 130 of the portable electronic device 100A is, for example, configured to sense single-point presses and/or press forces for the user to perform booting or other command operations on the portable electronic device 100A. The sensing component 130 of the portable electronic device 100A may also be configured to sense multi-point presses or even press traces for the user to perform volume control or other command operations by sliding along the frame 120. Of course, the foregoing description is merely illustrative and the application is not limited hereto.

Figure 3:
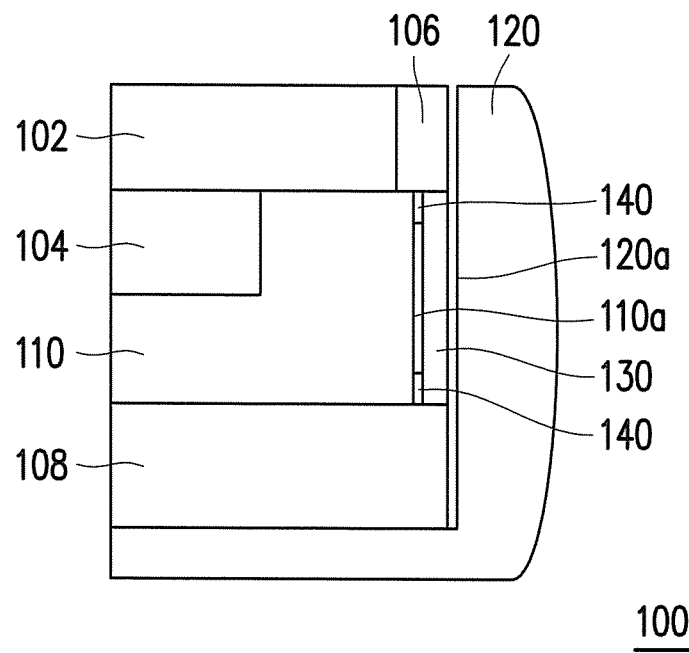
FIG. 3 is a partially enlarged view illustrating a cross section according to a second embodiment of the application.

FIG. 3 is a partially enlarged view illustrating a cross section according to a second embodiment of the application. Referring to FIG. 3, the embodiment of FIG. 3 is similar to FIG. 2. The difference is that a portable electronic device 100B of FIG. 3 further includes a buffer component 140. As illustrated in FIG. 3, the buffer component 140 is disposed between the sensing component 130 and the first sensing side surface 110a and is, for example, disposed close to two ends of the sensing component 130. However, the application is not limited hereto. The buffer component 140 is electrically insulative and is, for example, an insulator or a material coated with an insulation film so as not to affect sensing between the sensing component 130 and the first sensing side surface 110a. The buffer component 140 is, for example, a sponge, a double-sided adhesive tape, or another compressible material, so that when the user applies the external force to the frame 120, a variation in the distance between the sensing component 130 and the first sensing side surface 110a is still generated. The buffer component 140 prevents the distance between the sensing component 130 and the first sensing side surface 110a from being reduced to zero, thereby preventing bump and damage to the sensing component 130.

Figure 4:
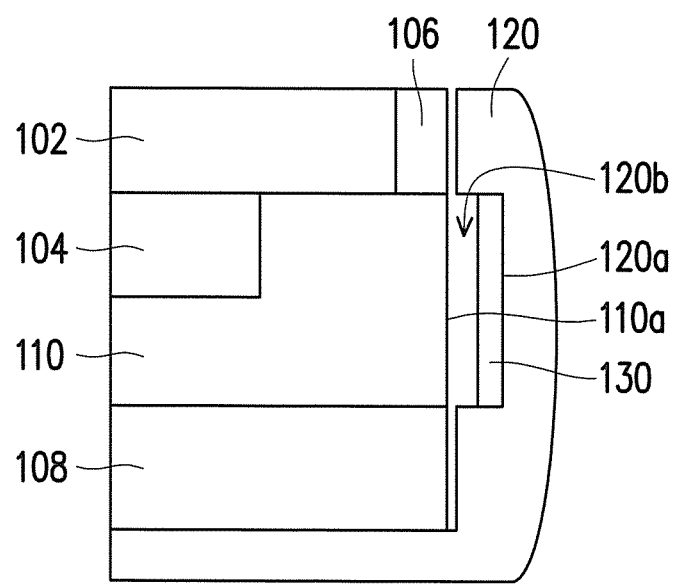
FIG. 4 is a partially enlarged view illustrating a cross section according to a third embodiment of the application.

FIG. 4 is a partially enlarged view illustrating a cross section according to a third embodiment of the application. Referring to FIG. 4, the embodiment of FIG. 4 is similar to FIG. 2. The difference is that the frame 120 of FIG. 4 includes a recess 120b. The sensing component 130 is disposed in the recess 120b and the second sensing side surface 120a is a bottom surface of the recess 120b. In other words, the sensing component 130 is disposed on the bottom surface of the recess 120b. The recess 120b is disposed to correspond to the first sensing side surface 110a, for example, such that the sensing component 130 disposed in the recess 120b can effectively sense the variation in the distance to the first sensing side surface 110a. The application does not limit a depth of the recess 120b. When the user applies the external force to the frame 120, a variation in the distance between the sensing component 130 and the first sensing side surface 110a is generated. Since the sensing component 130 is disposed on the bottom surface of the recess 120b, there is a fixed minimum distance between the sensing component 130 and the first sensing side surface 110a. When the user applies a greater external force to the frame 120, the distance between the sensing component 130 and the first sensing side surface 110a is not reduced to zero, and damage to the sensing component 130 resulting from bump does not occur. The first sensing side surface 110a and the second sensing side surface 120a are, for example, planes and are parallel to each other, so that the sensing component 130 can sense accurately. In the present embodiment, the user can perform command operations on the portable electronic device 100C without additionally disposing a mechanical button on the frame of the portable electronic device 100C. Such design not only reduces costs of disposing the mechanical button, but the material costs required for manufacturing the frame 120 are also reduced since the frame 120 includes the recess 120b.

Figure 5:
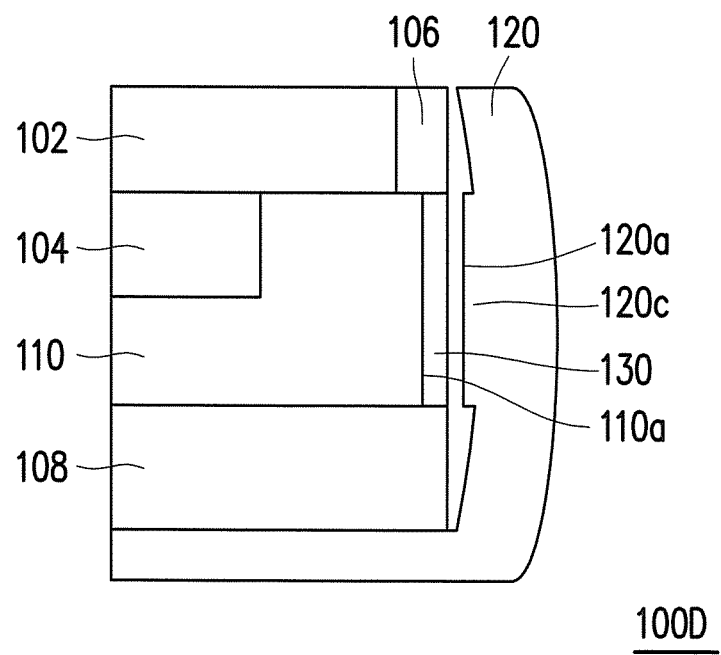
FIG. 5 is a partially enlarged view illustrating a cross section according to a fourth embodiment of the application.

FIG. 5 is a partially enlarged view illustrating a cross section according to a fourth embodiment of the application. Referring to FIG. 5, in the present embodiment, the frame 120 includes a protrusion 120c, and a surface of the protrusion 120c is the second sensing side surface 120a. The protrusion 120c is disposed to correspond to the sensing component 130, for example, such that a distance between the second sensing side surface 120a on the surface of the protrusion 120c and the sensing component 130 can be effectively sensed by the sensing component 130. Moreover, as long as the protrusion 120c does not contact the sensing component 130 and thus damage the sensing component 130, the application does not limit a thickness of the protrusion 120c. An inner side of the frame 120 has, for example, a curved contour. Disposing the protrusion 120c at the inner side having the curved contour of the frame 120 makes the first sensing side surface 110a and the second sensing side surface 120a planes and parallel to each other, such that sensing becomes easy and accuracy is enhanced. When the user applies the external force to the frame 120, a variation in the distance between the sensing component 130 and the second sensing side surface 120a is generated. The protrusion 120c and the frame 120 may be two independent components, or the protrusion 120c and the frame 120 may be integrated. By disposing the protrusion 120c, regardless of what the contour of the frame 120 of the present embodiment is, sensing between the sensing component 130 and the second sensing side surface 120a is not affected. Accordingly, the frame 120 of the portable electronic device 100D of the present embodiment may be designed according to the user's preference.

Figure 6:
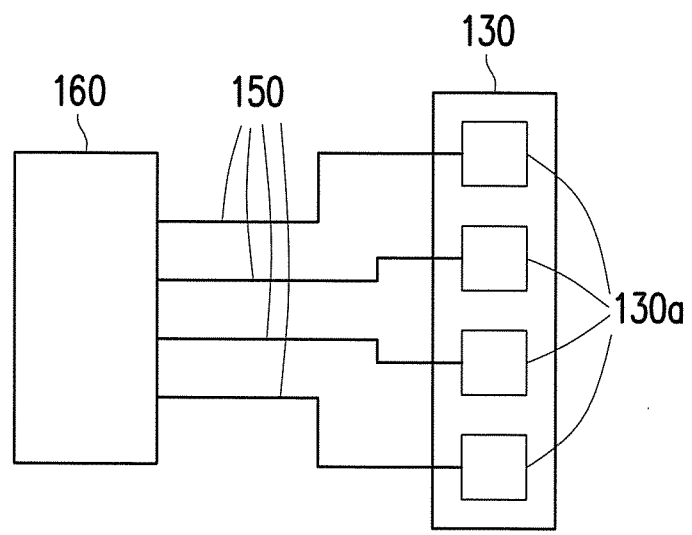
FIG. 6 is a schematic diagram illustrating components of a portable electronic device according to one embodiment of the application.

FIG. 6 is a schematic diagram illustrating a portable electronic device according to one embodiment of the application. Referring to FIG. 2 and FIG. 6, in the present embodiment, the sensing component 130 includes, for example, a plurality of sensing electrodes 130a disposed on a flexible circuit board that are independent of each other. The plurality of sensing electrodes 130a independent of each other, for example, each include a connection line 150, and the plurality of sensing electrodes 130a independent of each other are electrically connected to a processor 160 via the respective connection lines 150. When the user applies the external force to the frame 120, a variation in the distance between the sensing component 130 and the first sensing side surface 110a is generated. Each of the sensing electrodes 130a of the sensing component 130 respectively generates a sensing signal according to the variation in the distance, and the sensing signals are generated according to a capacitance variation generated by the variation in the distance. For example, a greater variation in the distance generates a greater capacitance variation, while a smaller variation in the distance generates a smaller capacitance variation. The connection lines 150 transmit the sensing signals to the processor 160, so that the processor 160 can trigger a command according to the sensing signals.

Figure 7:
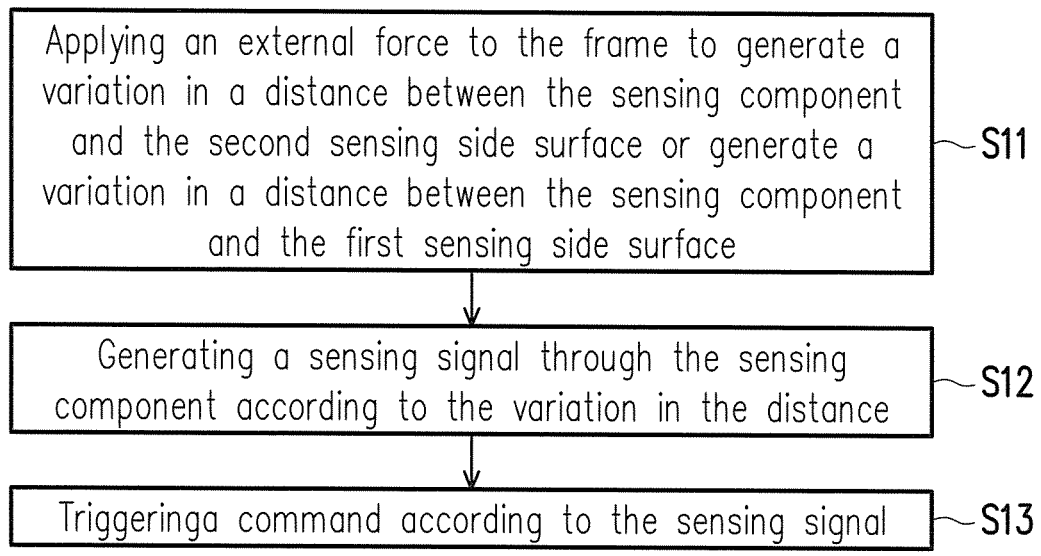
FIG. 7 is a flowchart illustrating a sensing method according to one embodiment of the application.

FIG. 7 is a flowchart illustrating a sensing method according to one embodiment of the application. Referring to FIG. 2 and FIG. 7, the sensing method of the present embodiment is adapted for the foregoing portable electronic devices 100A, 100B, 100C, 100D, or other portable electronic devices that are in line with the concept of the application. First, an external force is applied to the frame 120 to generate a variation in a distance between the sensing component 130 and the second sensing side surface 120a or generate a variation in a distance between the sensing component 130 and the first sensing side surface 110a (step S11). According to the variation in the distance, the sensing component 130 generates a sensing signal (step S12). A command is triggered according to the sensing signal (step S13).

Specifically, in the sensing method of the present embodiment, the user first applies the external force to the frame 120 of the portable electronic device 100A to thereby generate a variation in the distance between the sensing component 130 and the first sensing side surface 110a or generate a variation in the distance between the sensing component 130 and the second sensing side surface 120a (step S11). Next, the sensing component 130 generates a sensing signal according to the variation in the distance (step S12) and the sensing signal is generated according to a capacitance variation generated by the variation in the distance. Lastly, the processor 160 triggers a command according to the sensing signal (step S13). The connection line 150 transmits the sensing signal to the processor 160 to thereby cause the processor 160 to trigger a command to drive the portable electronic device 100A to perform operations such as booting, photographing, adjusting volume, etc. according to pre-set configurations.

For example, the processor 160 is configured to drive the portable electronic device 100A to perform the operation of booting when a received capacitance variation is smaller than a predetermined capacitance variation, and drive the portable electronic device 100A to perform the operation of photographing when the received capacitance variation is greater than a predetermined capacitance variation. When the user lightly touches the frame 120, the applied external force is smaller, the variation in the distance between the sensing component 130 and the first sensing side surface 110a is smaller, and the capacitance variation smaller than a predetermined capacitance variation is generated. When the processor 160 receives the capacitance variation smaller than a predetermined capacitance variation, the processor 160 triggers the command to drive the portable electronic device 100A to perform the operation of booting. When the user presses the frame 120 hard, the applied external force is greater, the variation in the distance between the sensing component 130 and the first sensing side surface 110a is greater, and the capacitance variation greater than a predetermined capacitance variation is generated. When the process 160 receives the capacitance variation greater than a predetermined capacitance variation, the processor 160 triggers the command to drive the portable electronic device 100A to perform the operation of photographing. Of course, more predetermined capacitance variations may be configured to trigger different commands when capacitance variations in different intervals are generated.

In summary of the above, in the portable electronic device and the sensing method of the embodiments of the application, when the user applies an external force to the frame to generate a variation in the distance between the sensing component and the second sensing side surface or generate a variation in the distance between the sensing component and the first sensing side surface, the sensing component generates a sensing signal according to the variation in the distance and then the command is triggered according to the sensing signal. Accordingly, the user only needs to apply an external force to the frame of the portable electronic device to trigger the command, and it is not necessary to additionally dispose a mechanical button on the frame of the portable electronic device. Such design not only reduces the costs, but also prevents mechanical abrasion and extends the service life. The portable electronic device without the mechanical button is good-looking, small in size, and close to the purpose of human-centered design. Moreover, when the portable electronic device of the application further includes the electrically insulative buffer component, damage resulting from bump between the sensing component and the first sensing side surface or the second sensing side surface can be prevented. Furthermore, when the sensing component of the portable electronic device of the application is disposed in the recess, there is a fixed minimum distance between the sensing component and the first sensing side surface. Therefore, when the user applies a greater external force to the frame, the sensing component and the first sensing side surface do not bump and thereby damage the sensing component. In addition, when the frame of the portable electronic device of the application further includes the protrusion, the first sensing side surface and the second sensing side surface are planes and are parallel to each other. Accordingly, the frame may be designed according to the user's preference and is not specifically limited.

It will be apparent to those skilled in the art that various modifications and variations can be made to the structure of the application without departing from the scope or spirit of the application. In view of the foregoing, it is intended that the application cover modifications and variations of this application provided they fall within the scope of the following claims and their equivalents.

What is claimed is:

1. A portable electronic device comprising:
    a supporting plate disposed inside the portable electronic device as a supporting structure of an interior of the portable electronic device and the supporting plate comprising a first sensing side surface;
    a frame comprising a second sensing side surface facing the first sensing side surface and the second sensing side surface having a recess facing toward the first sensing side surface and the supporting plate disposed inside the frame; and
    a sensing component disposed in the recess between the first sensing side surface and the second sensing side surface, the sensing component being configured to sense a variation in a distance to the first sensing side surface.

2. The portable electronic device according to claim 1, wherein the first sensing side surface and the second sensing side surface are planes and are parallel to each other.

3. The portable electronic device according to claim 1, further comprising a buffer component disposed between the sensing component and the second sensing side surface or disposed between the sensing component and the first sensing side surface.

4. The portable electronic device according to claim 1, wherein the sensing component comprises a plurality of sensing electrodes independent of each other.

5. A sensing method adapted for the portable electronic device according to claim 1, the sensing method comprising:
    applying an external force to the frame to generate a variation in a distance between the sensing component in the recess of the frame and the first sensing side surface;
    generating a sensing signal through the sensing component according to the variation of the distance between the sensing component and the first sensing side surface; and
    triggering a command according to the sensing signal.

6. The sensing method according to claim 5, wherein the sensing signal is generated according to a capacitance variation generated by the variation in the distance.

7. A portable electronic device comprising:
    a supporting plate disposed inside the portable electronic device as a supporting structure of an interior of the portable electronic device and the supporting plate comprising a first sensing side surface;
    a frame comprising a second sensing side surface facing the first sensing side surface and the supporting plate disposed inside the frame; and
    a sensing component disposed on the first sensing side surface between the first sensing side surface and the second sensing side surface, the sensing component being configured to sense a variation in a distance to the second sensing side surface.

8. The portable electronic device according to claim 7, wherein the first sensing side surface and the second sensing side surface are planes and are parallel to each other.

9. The portable electronic device according to claim 7, further comprising a buffer component disposed between the sensing component and the second sensing side surface or disposed between the sensing component and the first sensing side surface.

10. The portable electronic device according to claim 7, wherein the frame comprises a protrusion, and a surface of the protrusion is the second sensing side surface.

11. The portable electronic device according to claim 7, wherein the sensing component comprises a plurality of sensing electrodes independent of each other.

12. A sensing method adapted for the portable electronic device according to claim 7, the sensing method comprising:
    applying an external force to the frame to generate a variation in a distance between the sensing component on the first sensing side surface of the supporting plate and the second sensing side surface;
    generating a sensing signal through the sensing component according to the variation of the distance between the sensing component and the second sensing side surface and; and
    triggering a command according to the sensing signal.

* * * * *